United States Patent
Kris et al.

(10) Patent No.: US 10,044,264 B2
(45) Date of Patent: Aug. 7, 2018

(54) MICROCONTROLLER WITH AVERAGE CURRENT MEASUREMENT CIRCUIT USING VOLTAGE-TO-CURRENT CONVERTERS

(71) Applicant: Microchip Technology Incorporated, Chandler, AZ (US)

(72) Inventors: Bryan Kris, Gilbert, AZ (US); James Bartling, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 48 days.

(21) Appl. No.: 15/157,879

(22) Filed: May 18, 2016

(65) Prior Publication Data

US 2016/0344289 A1    Nov. 24, 2016

Related U.S. Application Data

(60) Provisional application No. 62/164,316, filed on May 20, 2015.

(51) Int. Cl.
| | | |
|---|---|---|
| *G05F 1/56* | (2006.01) | |
| *H02M 3/156* | (2006.01) | |
| *G01R 19/00* | (2006.01) | |
| *G01R 19/255* | (2006.01) | |
| *H02M 1/08* | (2006.01) | |
| *H03F 3/45* | (2006.01) | |

(Continued)

(52) U.S. Cl.
CPC .......... *H02M 3/156* (2013.01); *G01R 19/003* (2013.01); *G01R 19/255* (2013.01); *H02M 1/08* (2013.01); *H03F 3/45* (2013.01); *H03G 3/20* (2013.01); *H03M 1/1245* (2013.01); *H02M 2001/0009* (2013.01); *H03F 2203/45288* (2013.01)

(58) Field of Classification Search
CPC .......................................................... G05F 1/56
USPC ................................ 323/281–285, 351, 906
See application file for complete search history.

(56) References Cited

U.S. PATENT DOCUMENTS 6,243,034 B1    6/2001  Regier .......................... 341/166
6,486,643 B2 *  11/2002 Liu .................... H02M 7/53871
                                                          323/268

(Continued)

OTHER PUBLICATIONS

International Search Report and Written Opinion, Application No. PCT/US2016/033225, 12 pages, dated Jul. 28, 2016.

*Primary Examiner* — Adolf Berhane
*Assistant Examiner* — Nusrat Quddus
(74) *Attorney, Agent, or Firm* — Slayden Grubert Beard PLLC

(57) ABSTRACT

The average of a complex waveform measured over a time period may be determined by first converting the complex waveform to a voltage, then converting this voltage to a current and using this current to charge a capacitor. At the end of the measurement time period the voltage charge (sample voltage) on the capacitor may be sampled by a sample and hold circuit associated with an analog-to-digital converter (ADC). Then the voltage charge on the sample capacitor may be removed, e.g., capacitor plates shorted by a dump switch in preparation for the next average of the complex waveform sample measurement cycle. The ADC then converts this sampled voltage charge to a digital representation thereof and a true average of the complex waveform may be determined, e.g., calculated therefrom in combination with the measurement time period.

28 Claims, 5 Drawing Sheets

(51) Int. Cl.
*H03G 3/20* (2006.01)
*H03M 1/12* (2006.01)
*H02M 1/00* (2006.01)

(56) References Cited

U.S. PATENT DOCUMENTS

| | | | | |
|---|---|---|---|---|
| 7,414,553 | B1 | 8/2008 | Tsyrganovich | ............... 341/118 |
| 8,749,209 | B2 * | 6/2014 | Feldtkeller | .............. H02M 1/38 |
| | | | | 323/224 |
| 8,754,627 | B1 * | 6/2014 | Le | ............................ G05F 1/67 |
| | | | | 323/299 |
| 2012/0043818 | A1 * | 2/2012 | Stratakos | ................ H02J 3/383 |
| | | | | 307/77 |
| 2012/0262122 | A1 * | 10/2012 | Sato | .......................... H02J 7/00 |
| | | | | 320/128 |
| 2014/0265929 | A1 | 9/2014 | Gossehelweg et al. | ...... 315/307 |

* cited by examiner

MICROCONTROLLER WITH AVERAGE CURRENT MEASUREMENT CIRCUIT USING VOLTAGE-TO-CURRENT CONVERTERS

RELATED PATENT APPLICATION

This application claims priority to commonly owned U.S. Provisional Patent Application No. 62/164,316; filed May 20, 2015; which is hereby incorporated by reference herein for all purposes.

TECHNICAL FIELD

The present disclosure relates to microcontrollers, in particular, a microcontroller having an integrated average current measurement circuit.

BACKGROUND

In SMPS (switch mode power supply) applications, the power supply designer needs to measure the average current flow in the power supply. FIGS. 1(a) and 1(b) show typical current waveforms for traditional (classic) SMPS topologies. The simplest designs use peak current sensing which is often implemented with an analog comparator. In this scenario, the average current flow is simply one-half of the peak current (Ipk) (FIG. 1(a)). For applications where the current does not reach zero (FIG. 1(b)), two measurements are required to calculate average current flow: Imin and Imax. This is often implemented using a microcontroller with an integral analog-to-digital converter (ADC). In many newer SMPS topologies with many transistors switching in and out circuit elements during the PWM cycle, the sensed current waveform may be very irregular (FIG. 1(c)). To calculate the average current value over a sample period is very difficult because the signal transitions are too fast for an Analog-to-Digital Converter (ADC) to follow. The current waveform shown in FIG. 1(c) is a representation for current in a power supply using advanced soft-switching techniques to improve efficiency. The only effective method to measure this current waveform is to implement a method to "integrate under the curve" to obtain the total average current per sample period. Referring to FIG. 2, signal waveform sample has been done using an operational amplifier to "integrate under the curve" but requires a high resistance value resistor R which is physically large in size, the integrated output from the operation amplifier is inverted, and a negative power supply rail is required for the operation amplifier.

SUMMARY

Therefore a need exists for a simple and effective way to measure average values of complex current waveforms.

According to an embodiment, a microcontroller may comprise: an external connection configured to receive a voltage; a voltage-to-current converter having an input coupled to the external connection and adapted to convert the voltage to a current, wherein an output of the voltage-to-current converter may be coupled to a sample capacitor and the current therefrom charges the sample capacitor to a sample voltage during a measurement time period; an analog-to-digital converter (ADC) configured to be coupled to the sample capacitor after the measurement time period may be over, wherein the ADC samples and then converts the sample voltage on the sample capacitor to a digital representation thereof; and a sample voltage reset switch coupled to the sample capacitor, wherein the sample voltage reset switch may reset the sample capacitor to a substantially zero voltage after the ADC has sampled the sample voltage thereon.

According to a further embodiment, at least one sample time period adjustment capacitor may be configured to be selectively switched in parallel with the sample capacitor. According to a further embodiment, a programmable gain amplifier (PGA) may be coupled between the external connection and the input of the voltage-to-current converter. According to a further embodiment, a level shifter may be coupled between the PGA and the voltage-to-current converter. According to a further embodiment, the sample capacitor may also be used as a sample and hold capacitor for the ADC. According to a further embodiment, a buffer amplifier may be coupled between the sample capacitor and the ADC. According to a further embodiment, the buffer amplifier may have differential outputs and differential inputs, wherein the differential inputs thereof may be coupled to the sample capacitor differentially. According to a further embodiment, the voltage-to-current converter may be an operational transconductance amplifier (OTA). According to a further embodiment, the OTA comprises differential outputs may be coupled to the sample capacitor differentially. According to a further embodiment, a programmable gain amplifier (PGA) may have differential outputs and differential inputs and may be coupled between first and second external connections and differential inputs of the OTA. According to a further embodiment, an average current measurement controller may be coupled to a sample capacitor switch, at least one sample period adjustment capacitor switch, and a sample voltage reset switch.

According to another embodiment, a switch mode power supply (SMPS) may comprise: a power inductor having a first end coupled to a power source; a power switch coupled to a second end of the power inductor; a current measurement resistor coupled to the power switch and in series with power inductor, wherein a voltage across the current measurement resistor may be proportional to current through the power inductor; a rectifier coupled to the second end of the power inductor and the power switch; a filter capacitor coupled to the rectifier; a microcontroller may comprise: a connection configured to receive the voltage from the current measurement resistor; a voltage-to-current converter having an input coupled to the connection and adapted to convert the voltage to a current, wherein an output of the voltage-to-current converter may be coupled to a sample capacitor and the current therefrom charges the sample capacitor to a sample voltage during a measurement period; an analog-to-digital converter (ADC) configured to be coupled to the sample capacitor after the measurement period may be over, wherein the ADC samples and then converts the sample voltage on the sample capacitor to a digital representation thereof; a sample voltage reset switch coupled to the sample capacitor, wherein the sample voltage reset switch resets the sample capacitor to a substantially zero voltage after the ADC has sampled the sample voltage thereon; a SMPS controller coupled to the ADC and the power switch, and using the digital representation of the sample voltage when controlling the power switch; and a digital processor and memory.

According to yet another embodiment, a method for determining an average of a complex voltage waveform may comprise the steps of: coupling an external voltage to a voltage-to-current converter; converting the external voltage to a current with the voltage-to-current converter; coupling the current to a sample capacitor for a measurement time period, wherein the current charges the sample capacitor to a sample voltage during the measurement time period; sampling the sample voltage after the measurement time period with an analog-to-digital converter (ADC); converting the sampled sample voltage to a digital representation thereof with the ADC; resetting the sample capacitor to a substantially zero voltage after the ADC has sampled the sample voltage thereon; and determining an average of the external voltage taken over the measurement time period from the digital representation of the sampled sample voltage.

According to a further embodiment of the method may comprise the step of switching in parallel with the sample capacitor at least one sample time period adjustment capacitor for increasing a useable measurement time period. According to a further embodiment of the method may comprise the step of controlling gain of a programmable gain amplifier (PGA) coupled between the external voltage and the voltage-to-current converter. According to a further embodiment of the method the voltage-to-current converter may be an operational transconductance amplifier (OTA). According to a further embodiment of the method the step of sampling the sample voltage may be done with a sample and hold circuit associated with the ADC.

BRIEF DESCRIPTION OF THE DRAWINGS

A more complete understanding of the present disclosure may be acquired by referring to the following description taken in conjunction with the accompanying drawings wherein.

Figure 1A:
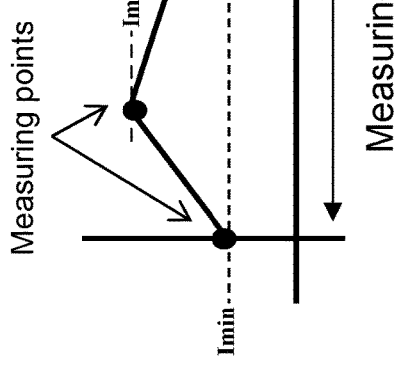
FIGS. 1(a)-1(c) illustrate schematic graphs of current waveforms found in switch mode power supplies (SMPS)
Figure 1C:
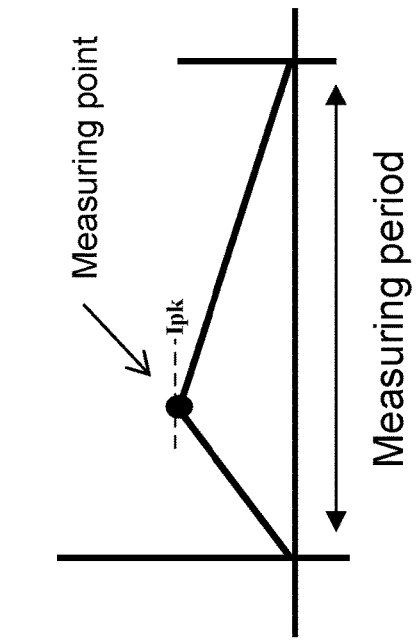
Figure 1B:
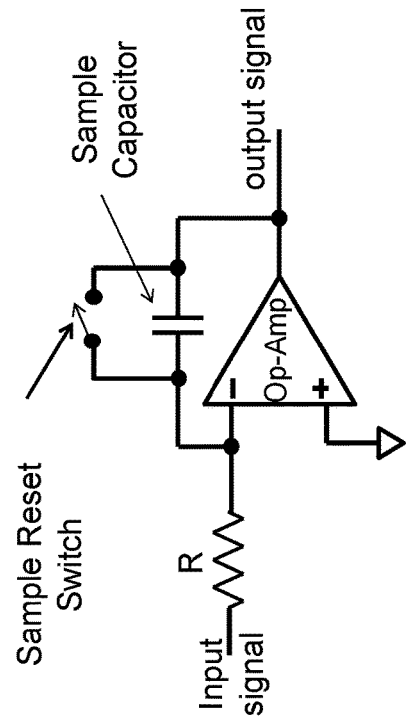
Figure 2:
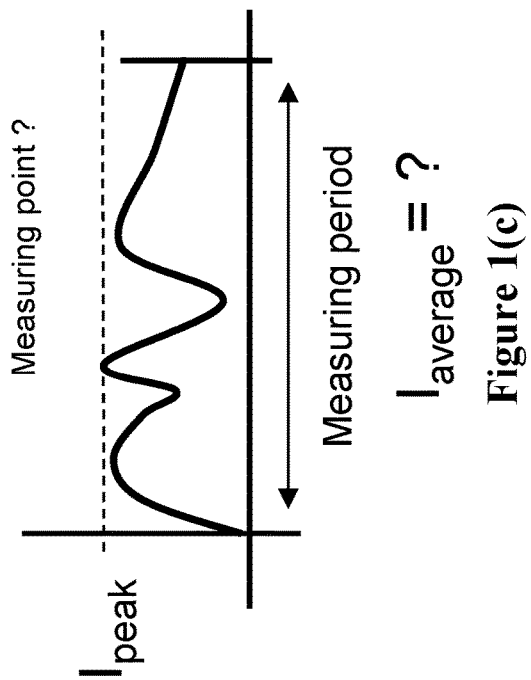
FIG. 2 illustrates a schematic diagram of an operational amplifier configured as an integrator circuit.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

DETAILED DESCRIPTION

According to various embodiments of this disclosure, an embedded system may comprise a central processing unit (CPU), memory and a plurality of peripheral devices to form a single chip system or a single chip microcontroller. According to various embodiments, a current integrator based on a voltage-to-current conversion circuit may be provided within a microcontroller. The various embodiments use a voltage-to-current converter to convert a noisy and/or complex waveform input signal into a current that gets integrated (averaged) into a voltage charge on a sample capacitor over a period of time. The magnitude of the charge, Q, on a capacitor plate is directly proportional to the potential difference, V, between the capacitor plates. Where C is a constant of proportionality called the capacitance of the capacitor. If the voltage, V, and capacitance, C, are known, then Q may be calculated and used in determining the average current from the value of the charge, Q, over the period of time it was taken. The voltage comprising the integrated current on a sample capacitor is then read once at the end of the measurement time period, then a true average current may be determined, e.g., calculated. After the voltage on the sample capacitor representing the integrated current sample is measured, the voltage charge on the sample capacitor is dumped to ground in preparation for the next current sample measurement cycle.

Referring now to the drawings, the details of example embodiments are schematically illustrated. Like elements in the drawings will be represented by like numbers, and similar elements will be represented by like numbers with a different lower case letter suffix.

Figure 3:
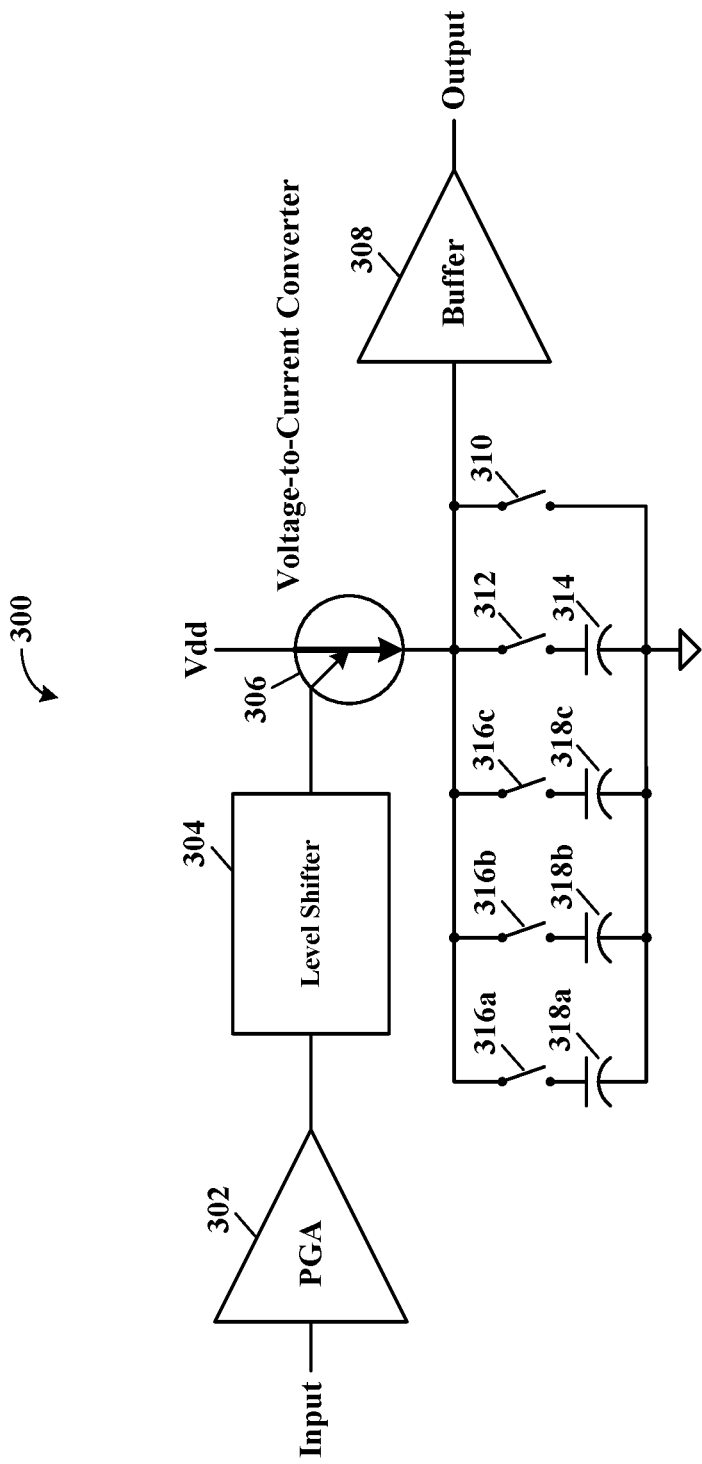
FIG. 3 illustrates a schematic circuit and block diagram of an average current measurement circuit, according to a specific example embodiment of this disclosure.

Referring to FIG. 3, depicted is a schematic circuit and block diagram of an average current measurement circuit, according to a specific example embodiment of this disclosure. An average current measurement circuit, generally represented by the numeral 300, may comprise a programmable gain amplifier (PGA) 302, a voltage level shifter 304, a voltage-to-current converter 306, a buffer amplifier 308, a plurality of switches 310, 312 and 316, an sample capacitor 314, and at least one sample time period adjustment capacitor 318. The signal (e.g., current from a SMPS) to be measured may be passed through the PGA 302 and the voltage level shifter 304. The amplified and voltage shifted signal may then be applied to the voltage-to-current converter 306. The current output of the voltage-to-current converter 306 may be coupled to the sample capacitor 314 when the switch 312 is closed. Over a measurement time period, the varying input voltage (e.g., voltage across resistor 614 shown in FIG. 6) charges the sample capacitor 314 over a measurement time period to a voltage proportional to the average current being measured. At the end of the measurement time period, the resulting voltage on the sample capacitor 314 may be read (via the output buffer 308) by an analog-to-digital converter (ADC) (e.g., ADC 608 shown in FIG. 6), e.g., using a sample and hold circuit associated with the ADC. This voltage represents the average current of a complex current waveform occurring within the measurement time period.

Once the ADC 608 has converted the analog voltage on the sample capacitor 314 to a digital representation thereof, the sample capacitor 314 may be "reset to ground" via the reset switch 310, and then the current measurement process repeats. FIG. 3 also shows at least one additional sample time period adjustment capacitor 318 that may be added via respective switch 316 to scale the resultant voltages depending on the measurement time period, e.g., adding more capacitance allows a longer charging time for a given voltage charge. Moreover, the PGA 302 may also add flexibility in scaling the signal voltage (e.g., derived from the current flowing through the measurement resistor 618 shown in FIG. 6) to be measured.

Existing microcontrollers, such as for example, dsPIC products manufactured by the assignee of the present application, already have current sources such as the charge time measurement unit (CTMU) and Current Bias Module. These circuits can be designed to be reconfigurable to allow for the implementation of an averaging current measurement according to the various specific example embodiments disclosed herein. Thus, circuit overhead for an additional current source is minimal. According to some embodiments, the sample capacitor 314 may be shared with the ADC sample and hold capacitor (not shown). Timing for resetting the sample capacitor 314 and ADC conversion initiation may already exist in dsPIC devices. The switches 310, 312 and 316 may be metal oxide semiconductor field effect transistors (MOSFETs).

Figure 4:
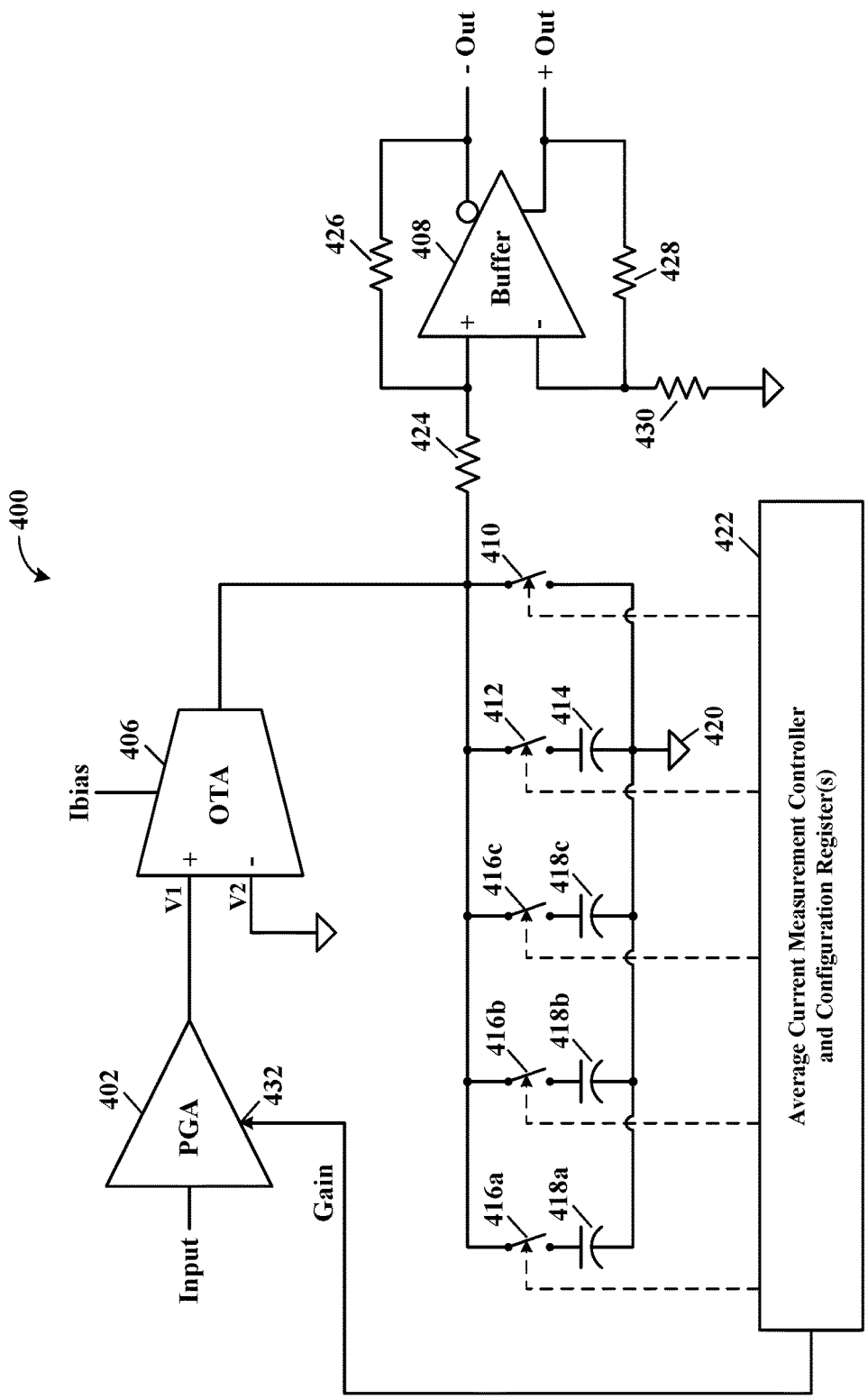
FIG. 4 illustrates a schematic circuit and block diagram of an average current measurement circuit, according to another specific example embodiment of this disclosure.

Referring to FIG. 4, depicted is a schematic circuit and block diagram of an average current measurement circuit, according to another specific example embodiment of this disclosure. An average current measurement circuit, generally represented by the numeral 400, may comprise a programmable gain amplifier (PGA) 402, an operational transconductance amplifier (OTA) 406 used as a voltage-to-current converter, a buffer amplifier 408, a plurality of switches 410, 412 and 416, a sample capacitor 414, at least one sample period adjustment capacitor 418, a plurality of resistors 424-430, and an average current measurement controller with configuration register(s) 422. An input voltage signal (e.g., current from a SMPS) to be measured may be passed through the PGA 402 and the OTA 406 where the input voltage signal may be converted into a current and may be coupled to the sample capacitor 414 when the switch 412 is closed. Over a measurement time period, the varying input voltage (e.g., voltage across resistor 614 shown in FIG. 6) charges the sample capacitor 414 over a measurement time period to a voltage proportional to the average current being measured. At the end of the measurement period, the resulting voltage on the sample capacitor 414 may be read (via the output buffer 408) by an analog-to-digital converter (ADC) (e.g., ADC 608 shown in FIG. 6). This voltage represents the average current of a complex current waveform occurring within the measurement time period.

Once the ADC 608 has converted the analog voltage on the sample capacitor 414 to a digital representation thereof, the sample capacitor 414 may be "reset to ground" via the reset switch 410, and then the current measurement process repeats. FIG. 4 also shows at least one additional sample time period adjustment capacitor 418 that may be added via respective at least one switch 416 to scale the resultant voltages depending on the measurement time period, e.g., adding more capacitance allows a longer charging time for a given voltage charge. Moreover, the PGA 402 may also add flexibility in scaling the signal voltage (e.g., derived from the current flowing through the measurement resistor 618 shown in FIG. 6) to be measured. According to some embodiments, the sample capacitor 414 may be shared with the ADC sample and hold capacitor (not shown). The switches 410, 412 and 416 may be metal oxide semiconductor field effect transistors (MOSFETs).

Figure 5:
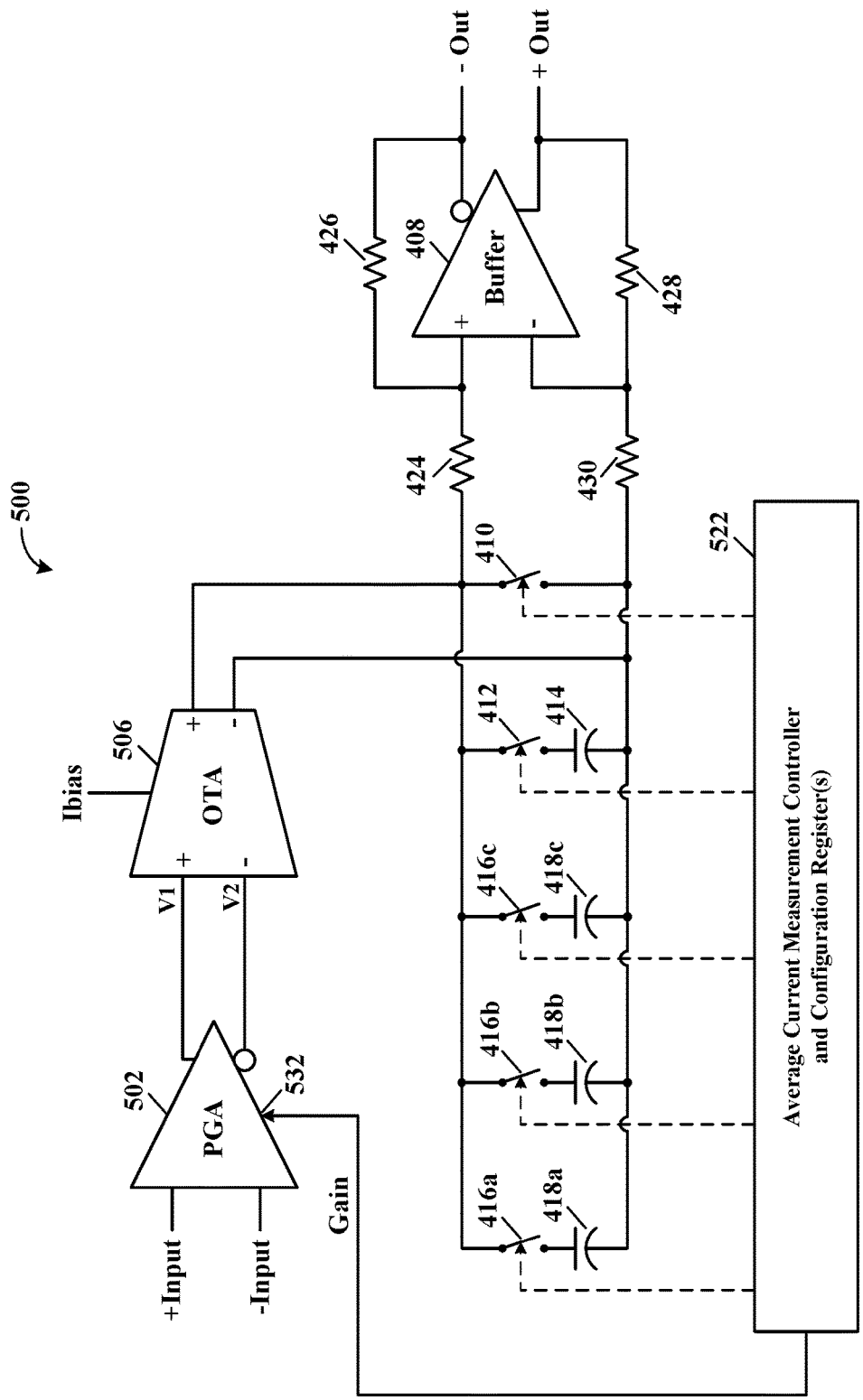
FIG. 5 illustrates a schematic circuit and block diagram of an average current measurement circuit, according to yet another specific example embodiment of this disclosure.

Referring to FIG. 5, depicted is a schematic circuit and block diagram of an average current measurement circuit, according to yet another specific example embodiment of this disclosure. An average current measurement circuit, generally represented by the numeral 500, may comprise a programmable gain amplifier (PGA) 502, an operational transconductance amplifier (OTA) 506 used as a voltage-to-current converter, a buffer amplifier 408, a plurality of switches 410, 412 and 416, an sample capacitor 414, at least one sample time period adjustment capacitor 418, a plurality of resistors 424-430, and an average current measurement controller with configuration register(s) 422. The circuit shown in FIG. 5 works in substantially the saw way as the circuit shown in FIG. 4, as more fully described hereinabove, but is fully differential from voltage input to the differential output of the buffer 408.

Figure 6:
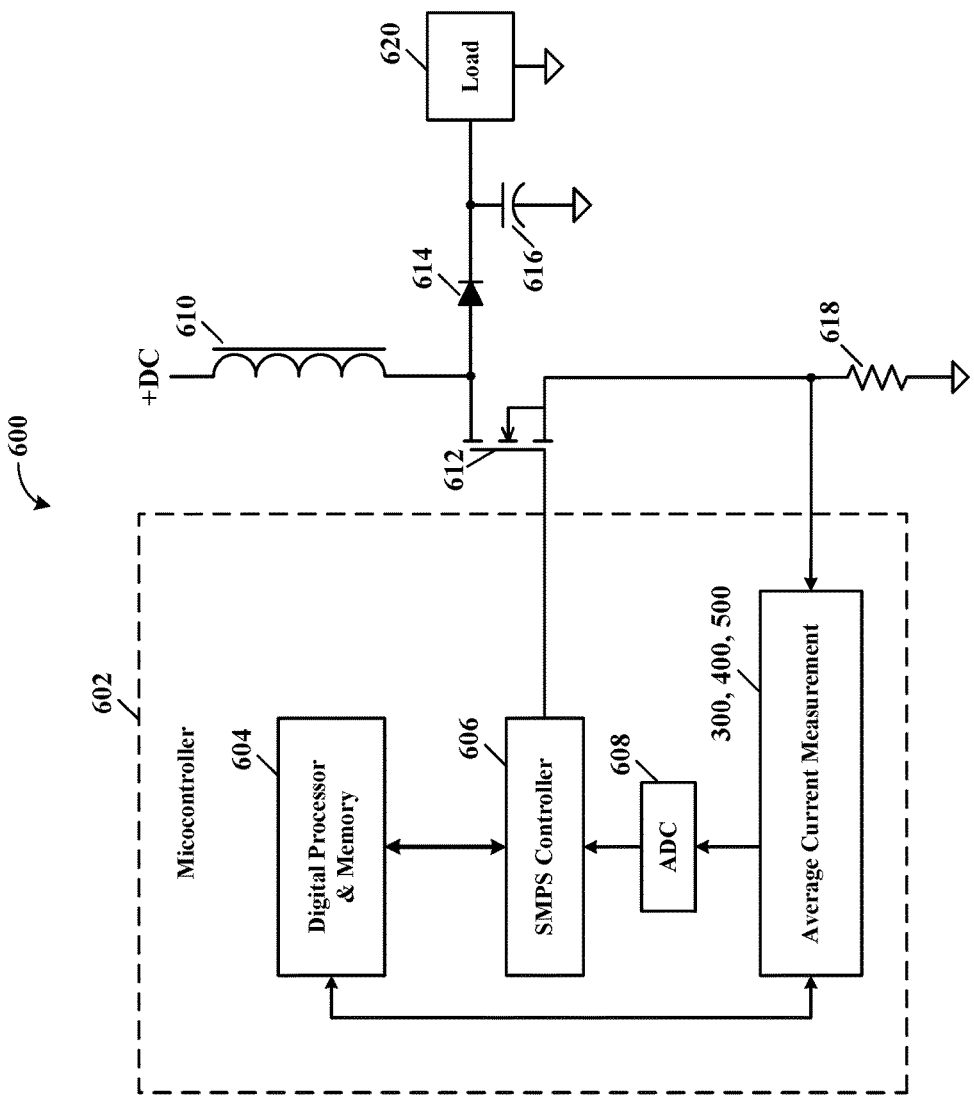
FIG. 6 illustrates a schematic circuit and block diagram of a switch mode power supply (SMPS) comprising a microcontroller having an average current measurement circuit and SMPS controller, according to specific example embodiments of this disclosure.

Referring to FIG. 6, depicted is a schematic circuit and block diagram of a switch mode power supply (SMPS) comprising a microcontroller having an average current measurement circuit and SMPS controller, according to specific example embodiments of this disclosure. The SMPS, generally represented by the numeral 600, may comprise a power inductor 610, a power switch 612, a power rectifier 614, a filter capacitor 616, a current measuring resistor 618, and a microcontroller 602 configured to power a load 620 from a DC power source. The microcontroller 602 may further comprise, among its other functions, a digital processor and memory 604, a SMPS controller 606, an ADC 608, and the average current measurement circuit shown in FIG. 3, 4 or 5.

The SMPS controller 606, in combination with a SMPS program in the digital processor and memory 604, may comprise a complex and sophisticated SMPS control function for efficient operation of the SMPS 600. The digital processor and memory 604 may also configure and control the average current measurement circuit of FIG. 3, 4 or 5, by programming the configuration registers of the average current measurement controller 422, 522, and gain of the PGA 402. According the teachings of this disclosure, a very simple way of measuring average current of noisy and/or complex current waveforms may be done quickly, without processor overhead, and with minimal addition circuit cost.

The invention claimed is:

1. A microcontroller, comprising:
    an external connection configured to receive a voltage from a shunt resistor;
    a voltage-to-current converter having an input coupled to the external connection and adapted to convert the voltage to a current, wherein an output of the voltage-to-current converter is coupled to a sample capacitor and the current therefrom charges the sample capacitor to a sample voltage during a measurement time period;
    at least one sample time period adjustment capacitor configured to be selectively switched in parallel with the sample capacitor;
    an analog-to-digital converter (ADC) configured to be coupled to the sample capacitor after the measurement time period is over, wherein the ADC samples and then converts the sample voltage on the sample capacitor to a digital representation thereof; and
    a sample voltage reset switch coupled to the sample capacitor, wherein the sample voltage reset switch resets the sample capacitor to a substantially zero voltage after the ADC has sampled the sample voltage thereon.

2. The microcontroller according to claim 1, further comprising a programmable gain amplifier (PGA) coupled between the external connection and the input of the voltage-to-current converter.

3. The microcontroller according to claim 2, further comprising a level shifter coupled between the PGA and the voltage-to-current converter.

4. The microcontroller according to claim 1, wherein the sample capacitor is also used as a sample and hold capacitor for the ADC.

5. The microcontroller according to claim 1, further comprising a buffer amplifier coupled between the sample capacitor and the ADC.

6. The microcontroller according to claim 5, wherein the buffer amplifier has differential outputs and differential inputs, wherein the differential inputs thereof are coupled to the sample capacitor differentially.

7. The microcontroller according to claim 1, wherein the voltage-to-current converter is an operational transconductance amplifier (OTA).

8. The microcontroller according to claim 7, wherein the OTA comprises differential outputs coupled to the sample capacitor differentially.

9. The microcontroller according to claim 7, further comprising a programmable gain amplifier (PGA) having differential outputs and differential inputs, wherein the PGA is coupled between first and second external connections and differential inputs of the OTA.

10. The microcontroller according to claim 1, further comprising an average current measurement controller coupled to a sample capacitor switch, at least one sample period adjustment capacitor switch, and the sample voltage reset switch.

11. A switch mode power supply (SMPS), comprising:
a power inductor having a first end coupled to a power source;
a power switch coupled to a second end of the power inductor;
a current measurement resistor coupled to the power switch and in series with power inductor, wherein a voltage across the current measurement resistor is proportional to current through the power inductor;
a rectifier coupled to the second end of the power inductor and the power switch;
a filter capacitor coupled to the rectifier;
a microcontroller, comprising:
  a connection configured to receive the voltage from the current measurement resistor;
  a voltage-to-current converter having an input coupled to the connection and adapted to convert the voltage to a current, wherein an output of the voltage-to-current converter is coupled to a sample capacitor and the current therefrom charges the sample capacitor to a sample voltage during a measurement period;
  an analog-to-digital converter (ADC) configured to be coupled to the sample capacitor after the measurement period is over, wherein the ADC samples and then converts the sample voltage on the sample capacitor to a digital representation thereof;
  a sample voltage reset switch coupled to the sample capacitor, wherein the sample voltage reset switch resets the sample capacitor to a substantially zero voltage after the ADC has sampled the sample voltage thereon;
  a SMPS controller coupled to the ADC and the power switch, and using the digital representation of the sample voltage when controlling the power switch; and
  a digital processor and memory.

12. A method for determining an average of a complex voltage waveform, said method comprising the steps of:
generating an external voltage by a shunt resistor; and
within a microcontroller performing the steps of:
coupling the external voltage to a voltage-to-current converter;
converting the external voltage to a current with the voltage-to-current converter;
coupling the current to a sample capacitor for a measurement time period, wherein the current charges the sample capacitor to a sample voltage during the measurement time period, wherein the step of coupling the current to a sample capacitor further comprises the step of: switching in parallel with the sample capacitor at least one sample time period adjustment capacitor for increasing a useable measurement time period;
sampling the sample voltage after the measurement time period with an analog-to-digital converter (ADC);
converting the sampled sample voltage to a digital representation thereof with the ADC;
resetting the sample capacitor to a substantially zero voltage after the ADC has sampled the sample voltage thereon; and
determining an average of the external voltage taken over the measurement time period from the digital representation of the sampled sample voltage.

13. The method according to claim 12, further comprising the step of controlling gain of a programmable gain amplifier (PGA) coupled between the external voltage and the voltage-to-current converter.

14. The method according to claim 12, wherein the voltage-to-current converter is an operational transconductance amplifier (OTA).

15. The method according to claim 12, wherein the step of sampling the sample voltage is done with a sample and hold circuit associated with the ADC.

16. A microcontroller, comprising:
an external connection configured to receive a voltage;
a voltage-to-current converter having an input coupled to the external connection and adapted to convert the voltage to a current, wherein an output of the voltage-to-current converter is coupled to a sample capacitor and the current therefrom charges the sample capacitor to a sample voltage during a measurement time period;
at least one sample time period adjustment capacitor configured to be selectively switched in parallel with the sample capacitor;
an analog-to-digital converter (ADC) configured to be coupled to the sample capacitor after the measurement time period is over, wherein the ADC samples and then converts the sample voltage on the sample capacitor to a digital representation thereof; and
a sample voltage reset switch coupled to the sample capacitor, wherein the sample voltage reset switch resets the sample capacitor to a substantially zero voltage after the ADC has sampled the sample voltage thereon.

17. The microcontroller according to claim 16, further comprising a programmable gain amplifier (PGA) coupled between the external connection and the input of the voltage-to-current converter.

18. The microcontroller according to claim 17, further comprising a level shifter coupled between the PGA and the voltage-to-current converter.

19. The microcontroller according to claim 16, wherein the sample capacitor is also used as a sample and hold capacitor for the ADC.

20. The microcontroller according to claim 16, further comprising a buffer amplifier coupled between the sample capacitor and the ADC.

21. The microcontroller according to claim 20, wherein the buffer amplifier has differential outputs and differential inputs, wherein the differential inputs thereof are coupled to the sample capacitor differentially.

22. The microcontroller according to claim 16, wherein the voltage-to-current converter is an operational transconductance amplifier (OTA).

23. The microcontroller according to claim 22, wherein the OTA comprises differential outputs coupled to the sample capacitor differentially.

24. The microcontroller according to claim 22, further comprising a programmable gain amplifier (PGA) having differential outputs and differential inputs, wherein the PGA is coupled between first and second external connections and differential inputs of the OTA.

25. The microcontroller according to claim 16, further comprising an average current measurement controller coupled to a sample capacitor switch, at least one sample period adjustment capacitor switch, and the sample voltage reset switch.

26. A microcontroller, comprising:
- an external connection configured to receive a voltage from a shunt resistor;
- a programmable gain amplifier (PGA) coupled with the external connection;
- a voltage-to-current converter having an input coupled to an output of the programmable gain amplifier and adapted to convert an output voltage of the programmable gain amplifier to a current, wherein an output of the voltage-to-current converter is coupled to a sample capacitor and the current therefrom charges the sample capacitor to a sample voltage during a measurement time period;
- an analog-to-digital converter (ADC) configured to be coupled to the sample capacitor after the measurement time period is over, wherein the ADC samples and then converts the sample voltage on the sample capacitor to a digital representation thereof; and
- a sample voltage reset switch coupled to the sample capacitor, wherein the sample voltage reset switch resets the sample capacitor to a substantially zero voltage after the ADC has sampled the sample voltage thereon.

27. The microcontroller according to claim 26, further comprising a level shifter coupled between the PGA and the voltage-to-current converter.

28. A microcontroller, comprising:
- an external connection configured to receive a voltage from a shunt resistor;
- an operational transconductance amplifier (OTA) having an input coupled to the external connection and adapted to convert the voltage to a current, wherein an output of the operational transconductance amplifier is coupled to a sample capacitor and the current therefrom charges the sample capacitor to a sample voltage during a measurement time period;
- an analog-to-digital converter (ADC) configured to be coupled to the sample capacitor after the measurement time period is over, wherein the ADC samples and then converts the sample voltage on the sample capacitor to a digital representation thereof; and
- a sample voltage reset switch coupled to the sample capacitor, wherein the sample voltage reset switch resets the sample capacitor to a substantially zero voltage after the ADC has sampled the sample voltage thereon.

* * * * *